(12) United States Patent
Chien

(10) Patent No.: US 6,603,670 B1
(45) Date of Patent: Aug. 5, 2003

(54) SUPPORTING DEVICE FOR COUPLING BATTERIES TO CIRCUIT BOARD

(75) Inventor: Min Ju Chien, Keelung (TW)

(73) Assignee: Giga-Byte Technology Co., Ltd., Taipei Hsien (TW)

( * ) Notice: Subject to any disclaimer, the term of this patent is extended or adjusted under 35 U.S.C. 154(b) by 0 days.

(21) Appl. No.: 10/325,945

(22) Filed: Dec. 23, 2002

(51) Int. Cl.⁷ .................................................. H05K 7/14
(52) U.S. Cl. ........................ 361/801; 361/807; 439/500; 439/341; 429/100
(58) Field of Search ................................ 361/801, 760, 361/807; 429/99, 100; 439/500, 680, 341, 376, 326, 96, 97, 100

(56) References Cited

U.S. PATENT DOCUMENTS

| | | | | |
|---|---|---|---|---|
| 4,487,820 A | * | 12/1984 | Engelstein et al. | 429/100 |
| 5,211,579 A | * | 5/1993 | Seong et al. | 439/500 |
| 5,805,423 A | * | 9/1998 | Wever et al. | 361/760 |
| 5,876,241 A | * | 3/1999 | Frantz | 439/500 |
| 5,980,309 A | * | 11/1999 | Frantz et al. | 439/500 |
| 6,124,056 A | * | 9/2000 | Kimura | 429/100 |
| 6,527,584 B2 | * | 3/2003 | Ninomiya | 439/500 |
| 6,530,804 B1 | * | 3/2003 | Wu | 439/500 |

* cited by examiner

Primary Examiner—David Martin
Assistant Examiner—Thanh S. Phan
(74) Attorney, Agent, or Firm—Rosenberg, Klein & Lee

(57) ABSTRACT

A supporting device includes a housing for receiving one or more batteries. A spring blade has a middle flap and an end limb secured to the board, and includes a bent segment for engaging with the batteries. Another spring blade is engaged through the board for attaching to the circuit board, and includes a panel for detachably securing the battery to the housing. The board has two legs for spacing the board from the circuit board.

16 Claims, 2 Drawing Sheets

SUPPORTING DEVICE FOR COUPLING BATTERIES TO CIRCUIT BOARD

BACKGROUND OF THE INVENTION

1. Field of the Invention

The present invention relates to a supporting device, and more particularly to a supporting device for supporting and coupling batteries to a circuit board.

2. Description of the Prior Art

Typical supporting devices for supporting batteries comprise a housing for receiving one or more batteries therein, and including two conductors coupled to the positive and the negative electrodes of the batteries respectively. However, the supporting devices may not be easily attached onto the circuit board. Additional fasteners or latches or the like are further required to be attached onto the circuit board, for selectively supporting or securing the supporting devices. The batteries thus may not be easily attached or secured onto the circuit board.

The present invention has arisen to mitigate and/or obviate the afore-described disadvantages of the conventional supporting devices for supporting the batteries.

SUMMARY OF THE INVENTION

The primary objective of the present invention is to provide a supporting device for coupling batteries to circuit boards, and for allowing the batteries to be easily and quickly attached or assembled onto the circuit board.

In accordance with one aspect of the invention, there is provided a supporting device for a circuit board, the supporting device comprising a housing including a board having a first and a second passages formed therein, and a pathway formed therein and located between the first and the second passages thereof, a first spring blade including a middle portion having a flap extended therefrom and engaged into the pathway of the board, and including a first end having a limb extended therefrom and engaged through the first passage of the board, for attaching to the circuit board, and for securing the board and the first spring blade to the circuit board, the first spring blade including a second end. The housing includes a first and a second walls provided on the board, the first wall includes at least one protrusion extended therefrom. One or more batteries are engaged between the first and the second walls of the housing, and engaged with the protrusion of the housing, and engaged with the second end of the first spring blade. A second spring blade is engaged through the second passage of the board, for attaching to the circuit board, and for securing the board and the second spring blade to the circuit board, the second spring blade includes a panel engaged with the battery for detachably securing the battery to the housing.

The flap of the first spring blade includes a projection extended therefrom and engaged with the board, for securing the flap of the first spring blade to the board. The board includes a recess formed therein, the first spring blade includes a bent segment provided on the second end thereof and partially received in the recess of the board.

The battery includes a central electrode engaged with the bent segment of the first spring blade. The housing includes a peripheral fence extended upwardly from the board for defining a chamber in the peripheral fence and the board, and for receiving the battery in the chamber of the housing.

The second spring blade includes a bar extended therefrom and inclined relative to the second spring blade, and the panel is extended from the bar and offset from the second spring blade.

The second spring blade includes a catch extended from the panel and engaged with the at least one battery. The panel includes a handle provided therein for moving the panel relative to the housing, to disengage the catch of the panel from the battery.

The board includes a first and a second legs extended downwardly therefrom for engaging with the circuit board and for spacing the board from the circuit board.

The limb of the first spring blade includes a prong extended therefrom and extended downwardly beyond the first leg of the board, for engaging with the circuit board. The first leg of the board includes a passageway formed therein, the limb of the first spring blade includes a catch extended therefrom and engaged into the passageway of the first leg of the board, and engaged with the board.

The second spring blade includes a prong extended therefrom and extended downwardly beyond the second leg of the board, for engaging with the circuit board. The second leg of the board includes a passageway formed therein, the second spring blade includes a catch extended therefrom and engaged into the passageway of the second leg of the board, and engaged with the board.

The flap is bent from the first spring blade, and forms an opening in the first spring blade.

Further objectives and advantages of the present invention will become apparent from a careful reading of the detailed description provided hereinbelow, with appropriate reference to the accompanying drawings.

DETAILED DESCRIPTION OF THE PREFERRED EMBODIMENT

Figure 1:
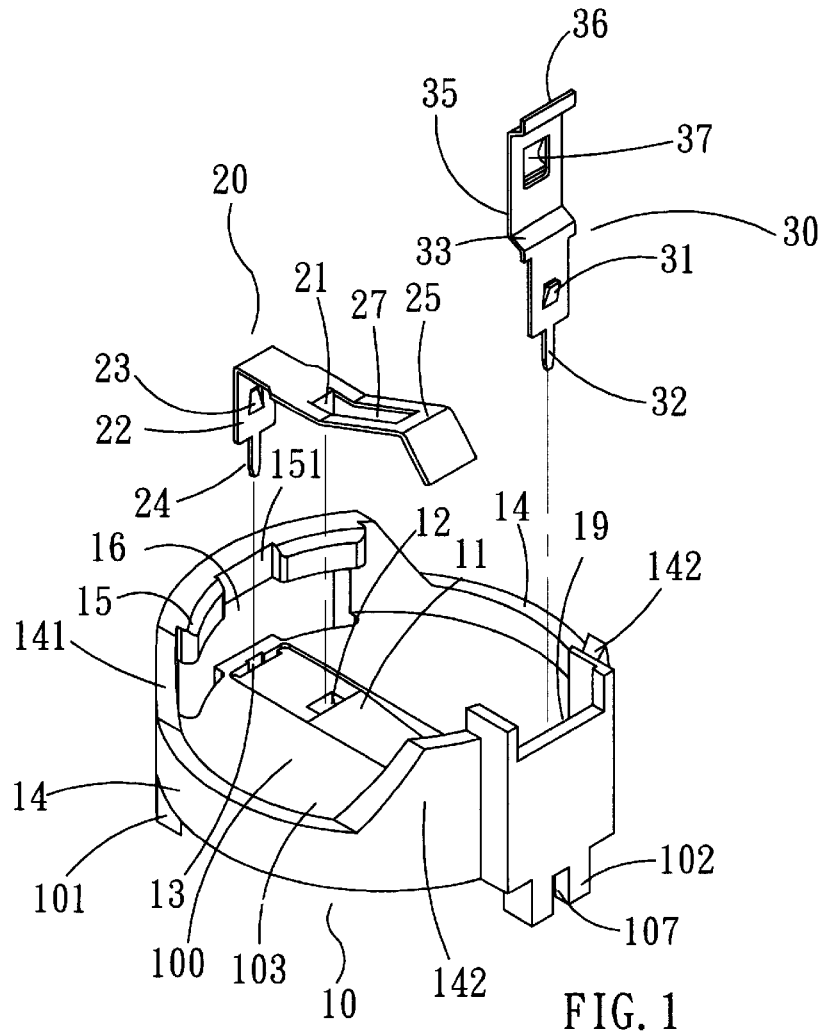
FIG. 1 is an exploded view of a supporting device for coupling batteries to circuit board in accordance with the present invention.
Figure 2:
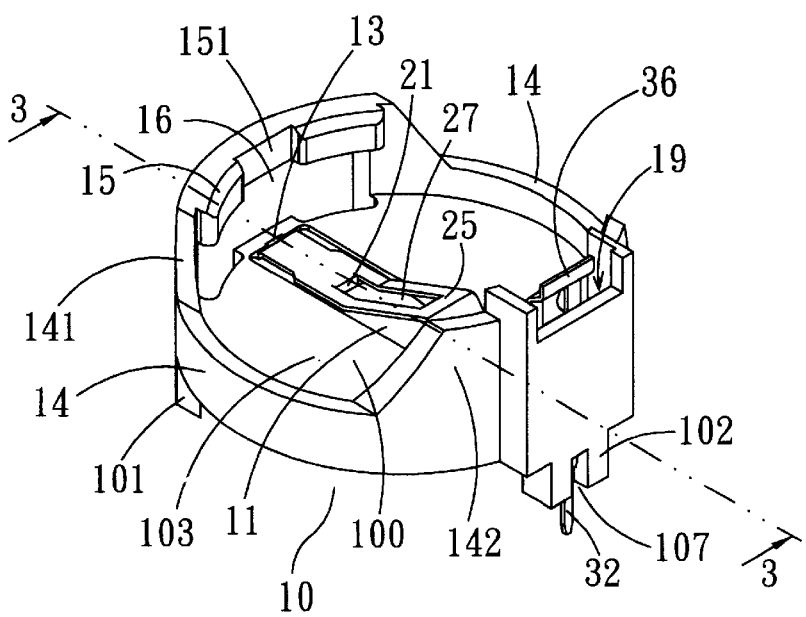
FIG. 2 is a perspective view of the supporting device for coupling batteries to circuit board.
Figure 3:
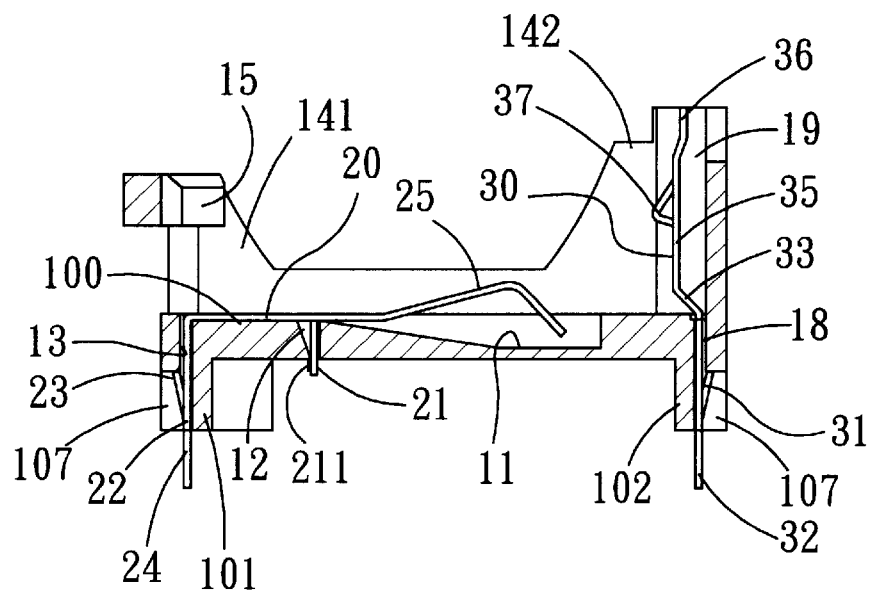
FIG. 3 is a cross sectional view taken along lines 3—3 of FIG. 2.
Figure 4:
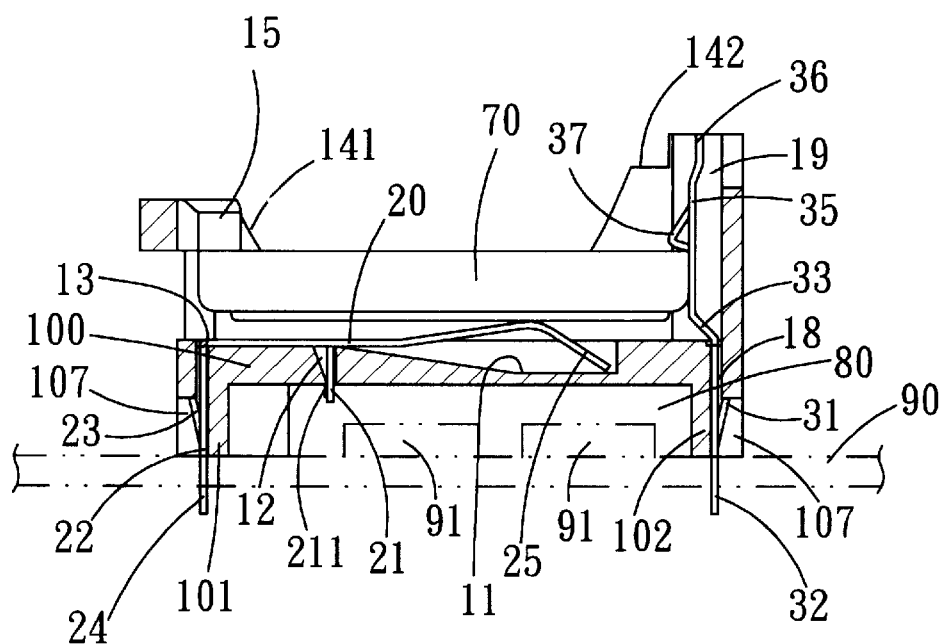
FIG. 4 is a cross sectional view similar to FIG. 3, illustrating the operation of the supporting device for coupling batteries to circuit board.

Referring to the drawings, and initially to FIGS. 1–3, a supporting device in accordance with the present invention is provided for supporting one or more batteries 70 (FIG. 4) therein and for easily and readily attaching or assembling the supporting device and thus the batteries 70 to the circuit board 90 (FIG. 4).

The supporting device comprises a housing 10 including a board 100 having one or more, such as two legs 101, 102 extended downwardly therefrom, and spaced away from each other, and preferably oppositely formed and provided on the opposite sides of the board 100. The legs 101, 102 each includes a passageway 107 formed therein.

The housing 10 includes one or more, such as two passages 13, 18 oppositely formed in the board 100, and aligned with the passageways 107 of the legs 101, 102 of the housing 10 respectively, and includes a reces 11 formed therein, and preferably arranged or located between the passages 13, 18 thereof, and includes a pathway 12 formed therein and preferably communicating with the recess 11 thereof, and also preferably arranged or located between the passages 13, 18 thereof.

The housing 10 includes a peripheral fence 14 extended upwardly from the outer peripheral portion of the board 100, for forming or defining a chamber 103 between the board 100 and the peripheral fence 11, and for receiving the batteries 70 (FIG. 4) in the chamber 103 of the housing 10.

The housing 10 further includes one or more, such as two opposite walls 141, 142 extended upwardly from the peripheral fence 11, and spaced away from each other, or directly and oppositely formed on the housing 10. The walls 141, 142 each includes a depression 16, 19 formed therein, and preferably aligned with the passages 13, 18 of the housing 10 respectively.

The wall 141 includes one or more, such as two protrusions 15 extended therefrom, such as extended toward the other wall 142, and a notch 151 formed or defined between the protrusions 15, and preferably aligned with the passage 13 of the housing 10, and communicating with the depression 16 of the housing 10.

A spring blade 20 includes a flap 21 extended downwardly therefrom, such as punched therefrom for forming an opening 27 in the spring blade 20. The flap 21 is engaged into the passage 12 of the housing 10 for securing the spring blade 20 to the board 100 of the housing 10. The flap 21 preferably includes a projection 211 (FIGS. 3, 4) extended therefrom and engaged with the board 100, for positioning or securing the flap 21 and thus the spring blade 20 to the board 100 of the housing 10.

The spring and/or conductor blade 20 includes one end having a curved or bent segment 25 formed therein, for increasing the resilience of the bent segment 25 thereof, and partially received in the recess 11 of the board 100, and for engaging with and for biasing against the batteries 70, best shown in FIG. 4. The batteries 70 may have a peripheral portion engaged into the depression 16 of the housing 17 and engaged with the protrusions 15 (FIG. 4), for allowing the batteries 70 to be secured or retained to the housing 10.

The spring blade 20 further includes a limb 22 extended downwardly therefrom, such as extended from the other end thereof, for engaging into the passage 13 of the housing 10, via the notch 151 and/or the depression 16 of the housing 10. The limb 22 includes a catch 23 extended therefrom and engaged into the passageway 107 of the leg 101, and thus for further securing the limb 22 of the spring blade 20 to the housing 10.

The limb 22 includes a prong 24 extended therefrom for engaging into or through the circuit board 90 (FIG. 4). The prong 24 of the limb 22 may be easily engaged into or through the circuit board 90 with machines (not shown), for allowing the housing 10 and the spring blade 20 to be easily attached or secured onto the circuit board 90. The prong 24 of the limb 22 may further be solidly secured to the circuit board 90 with such as welders or the like.

Another spring and/or conductor blade 30 is provided for engaging into the other passage 18 of the housing 10, via the depression 19 of the housing 10, and includes a catch 31 extended therefrom and engaged into the passageway 107 of the other leg 102, and thus for securing the spring blade 30 to the housing 10.

The spring blade 30 also includes a prong 32 extended therefrom for engaging into or through the circuit board 90 (FIG. 4), such as for being easily engaged into or through the circuit board 90 with machines (not shown), for allowing the housing 10 and the spring blade 30 to be easily attached or secured onto the circuit board 90. The prong 32 of the spring blade 30 may also be solidly secured to the circuit board 90 with such as solders or the like.

The spring blade 30 includes a bar 33 extended therefrom, such as inclined relative to the spring blade 30, and a panel 35 extended upwardly from the bar 33, and preferably parallel to the spring blade 30, but offset from the spring blade 30. The panel 35 and the bar 33 may be received in the depression 19 of the housing 10, for engaging with the batteries 70.

The panel 35 of the spring blade 30 includes another catch 37 extended therefrom, for engaging with the batteries 70, and for detachably securing the batteries 70 to the housing 10. The spring blade 30 further includes a handle 36 provided or formed thereon, such as formed on top of the panel 35, for moving the panel 35 relative to the housing 30, and for tilting or disengaging the catch 37 from the batteries 70.

When the panel 35 is moved or tilted relative to the housing 30 by the handle 36, the catch 37 may be moved or disengaged from the batteries 70, or the batteries 70 may be loosened from the catch 37. At this moment, the bent segment 25 of the spring blade 20 may bias or spring the batteries 70 upwardly or away from the board 100 of the housing 10, for allowing the batteries 70 to be easily removed from the housing 10.

In operation, the battery 70 may have one side portion thereof engaged into the depression 16 of the housing 10, and engaged with the protrusions 15, and may have the other side portion thereof moved beyond or over the catch 37 of the spring blade 30, for allowing the battery 70 to be easily and quickly attached or secured to the housing 10 with the catch 37. The bent segment 25 of the spring blade 20 may bias or spring against the batteries 70 at this moment.

When it is required to disengage the battery 70 from the housing 10, it is only required to move the spring blade 30 or to move the panel 35 relative to the housing 10 with the handle 36, in order to disengage or to loosen the catch 37 from the battery 70, for allowing the batteries 70 to be biased or sprung upwardly or away from the board 100 of the housing 10 by the spring blade 20.

It is to be noted that the prongs 24, 32 of the spring blades 20, 30 may be easily and quickly and readily engaged into or through the circuit board 90, for allowing the supporting device to be easily attached onto the circuit board 90. In addition, the spring blades 20, 30 may be electrically coupled to the central electrode and the case electrode of the battery 70 respectively, for allowing the battery 70 to be electrically coupled to the circuit board 90 with the spring blades 20, 30 without additional conductors.

As best shown in FIG. 4, the board 100 of the housing 10 may be spaced or elevated from the circuit board 90 by the legs 101, 102, such that a space 80 may be formed and provided in the lower portion of the housing 10, and such that one or more electric parts or elements 91 may be attached to the circuit board 90 and received in the space 80 of the housing 10, and thus protected by the housing 10. Accordingly, the supporting device in accordance with the present invention may be provided for allowing the batteries to be easily and quickly attached or assembled onto the circuit board.

Although this invention has been described with a certain degree of particularity, it is to be understood that the present disclosure has been made by way of example only and that numerous changes in the detailed construction and the combination and arrangement of parts may be resorted to without departing from the spirit and scope of the invention as hereinafter claimed.

I claim:

1. A supporting device for a circuit board, said supporting device comprising:

a housing including a board having a first and a second passages formed therein, and a pathway formed therein and located between said first and said second passages thereof, a first spring blade including a middle portion having a flap extended therefrom and engaged into said pathway of said board, and including a first end having a limb extended therefrom and engaged through said first passage of said board, for attaching to the circuit board, and for securing said board and said first spring blade to the circuit board, said first spring blade including a second end, said housing including a first and a second walls provided on said board, said first wall including at least one protrusion extended therefrom, at least one battery engaged between said first and said second walls of said housing, and engaged with said at least one protrusion of said housing, and engaged with said second end of said first spring blade, and a second spring blade engaged through said second passage of said board, for attaching to the circuit board, and for securing said board and said second spring blade to the circuit board, said second spring blade including a panel engaged with said at least one battery for detachably securing said at least one battery to said housing.

2. The supporting device according to claim 1, wherein said flap of said first spring blade includes a projection extended therefrom and engaged with said board, for securing said flap of said first spring blade to said board.

3. The supporting device according to claim 1, wherein said limb of said first spring blade includes a catch extended therefrom and engaged with said board, for securing said limb of said first spring blade to said board.

4. The supporting device according to claim 1, wherein said second spring blade includes a catch extended therefrom and engaged with said board, for securing said second spring blade to said board.

5. The supporting device according to claim 1, wherein said board includes a recess formed therein, said first spring blade includes a bent segment provided on said second end thereof and partially received in said recess of said board.

6. The supporting device according to claim 5, wherein said at least one battery includes a central electrode engaged with said bent segment of said first spring blade.

7. The supporting device according to claim 1, wherein said housing includes a peripheral fence extended upwardly from said board for defining a chamber in said peripheral fence and said board, and for receiving said at least one battery in said chamber of said housing.

8. The supporting device according to claim 1, wherein said second spring blade includes a bar extended therefrom and inclined relative to said second spring blade, and said panel is extended from said bar and offset from said second spring blade.

9. The supporting device according to claim 8, wherein said second spring blade includes a catch extended from said panel and engaged with said at least one battery.

10. The supporting device according to claim 9, wherein said panel includes a handle provided therein for moving said panel relative to said housing, to disengage said catch of said panel from said at least one battery.

11. The supporting device according to claim 1, wherein said board includes a first and a second legs extended downwardly therefrom for engaging with the circuit board and for spacing said board from the circuit board.

12. The supporting device according to claim 11, wherein said limb of said first spring blade includes a prong extended therefrom and extended downwardly beyond said first leg of said board, for engaging with the circuit board.

13. The supporting device according to claim 12, wherein said first leg of said board includes a passageway formed therein, said limb of said first spring blade includes a catch extended therefrom and engaged into said passageway of said first leg of said board, and engaged with said board.

14. The supporting device according to claim 11, wherein said second spring blade includes a prong extended therefrom and extended downwardly beyond said second leg of said board, for engaging with the circuit board.

15. The supporting device according to claim 14, wherein said second leg of said board includes a passageway formed therein, said second spring blade includes a catch extended therefrom and engaged into said passageway of said second leg of said board, and engaged with said board.

16. The supporting device according to claim 1, wherein said flap is bent from said first spring blade, and forms an opening in said first spring blade.

* * * * *